(12) United States Patent
Miyatake

(10) Patent No.: US 9,053,760 B2
(45) Date of Patent: Jun. 9, 2015

(54) SEMICONDUCTOR DEVICE INCLUDING A SENSE AMPLIFIER

(71) Applicant: PS4 Luxco S.a.r.l., Luxembourg (LU)

(72) Inventor: Shinichi Miyatake, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/939,080

(22) Filed: Jul. 10, 2013

(65) Prior Publication Data

US 2014/0022857 A1    Jan. 23, 2014

(30) Foreign Application Priority Data

Jul. 10, 2012  (JP) .................................. 2012-154224

(51) Int. Cl.
```
G11C 7/00       (2006.01)
G11C 7/06       (2006.01)
G11C 11/4091    (2006.01)
G11C 11/4097    (2006.01)
H01L 27/02      (2006.01)
H01L 27/108     (2006.01)
H01L 27/11      (2006.01)
```
(52) U.S. Cl.
CPC ............ *G11C 7/065* (2013.01); *G11C 11/4091* (2013.01); *G11C 11/4097* (2013.01); *H01L 27/0207* (2013.01); *H01L 27/10897* (2013.01); *H01L 27/1116* (2013.01)

(58) Field of Classification Search
CPC .................................................. G11C 11/4091
USPC ............................................ 365/63, 203, 205
See application file for complete search history.

(56) References Cited

U.S. PATENT DOCUMENTS

| | | | |
|---|---|---|---|
| 7,193,912 B2 | 3/2007 | Obara et al. | |
| 7,440,350 B2 | 10/2008 | Obara et al. | |
| 2003/0031071 A1* | 2/2003 | Kato | ............................. 365/207 |
| 2005/0226081 A1* | 10/2005 | Kajitani et al. | .......... 365/230.03 |
| 2005/0265096 A1 | 12/2005 | Obara et al. | |
| 2007/0159901 A1 | 7/2007 | Obara et al. | |
| 2010/0213525 A1* | 8/2010 | Masuoka et al. | ............... 257/306 |

FOREIGN PATENT DOCUMENTS

JP    2005-340367 A    12/2005

* cited by examiner

*Primary Examiner* — Hoai V Ho

(57) ABSTRACT

A semiconductor device including a sense amplifier that includes a first transistor and a second transistor. The first transistor includes a first gate electrode formed over a first channel region and connected to a first bit line, a first diffusion region connected to a second bit line with a first side edge defining the first channel region, and a second diffusion region connected to a power line and includes a second side edge defining the first channel region. The second transistor includes a second gate electrode formed over a second channel region and connected to the second bit line, a third diffusion region connected to the first bit line and includes a third side edge defining the second channel region, and a fourth diffusion region connected to the power line with a fourth side edge defining the second channel region. Directions of the bit lines and diffusion side edges are prescribed.

19 Claims, 9 Drawing Sheets

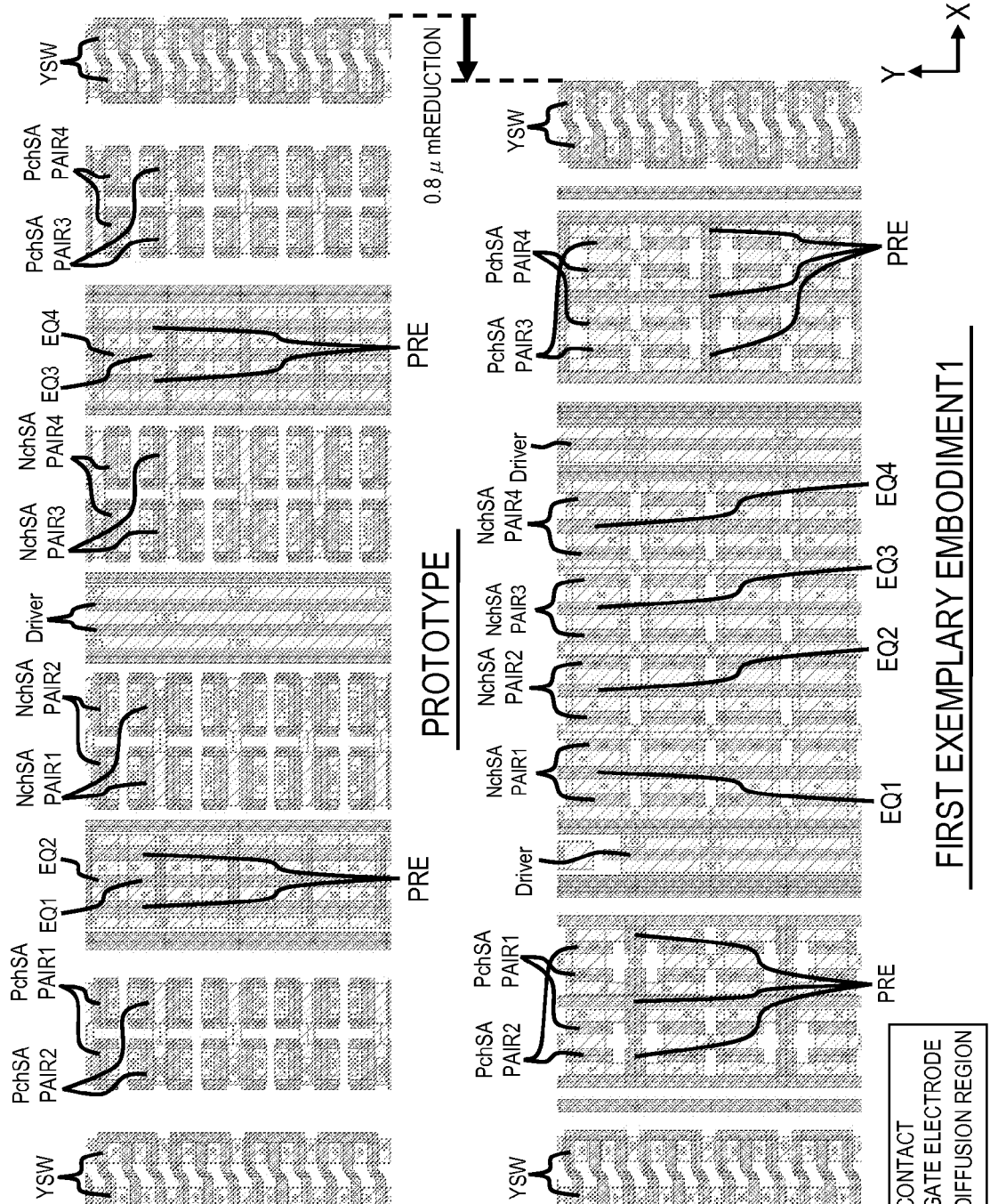

US 9,053,760 B2

SEMICONDUCTOR DEVICE INCLUDING A SENSE AMPLIFIER

TECHNICAL FIELD

Reference to Related Application

This application is based upon and claims the benefit of the priority of Japanese patent application No. JP2012-154224, filed on Jul. 10, 2012, the disclosure of which is incorporated herein in its entirety by reference thereto.

The present invention relates to a semiconductor device provided with a memory circuit.

BACKGROUND OF THE INVENTION

With regard to a semiconductor device (including a semiconductor integrated circuit device) provided with a memory circuit, JP-P2005-340367A, which corresponds to U.S. Pat. No. 7,193,912 B2 and U.S. Pat. No. 7,440,350 B2, discloses a layout example of a sense amplifier circuit including an equalizer circuit and a precharge circuit.

DISCUSSION OF RELATED ART

The following analysis is given by the inventor of the present application.

JP-P2005-340367A, however, does not suggest anything concerning a relationship between a bit line arrangement and a gate electrode in a transistor provided in a sense amplifier circuit. Therefore, the inventor of the present application have studied a layout that enables a reduction in area of a sense amplifier region by an effective transistor arrangement in a sense amplifier circuit.

SUMMARY

According to a first aspect of the present invention, there is provided a semiconductor device that comprises a sense amplifier that includes a first transistor and a second transistor. The transistor includes a first gate electrode that is formed over a first channel region and connected to a first bit line, a first diffusion region that is connected to a second bit line and includes a first side edge defining the first channel region and a second diffusion region that is connected to a power line and includes a second side edge defining the first channel region, and the second transistor includes a second gate electrode that is formed over a second channel region and connected to the second bit line, a third diffusion region that is connected to the first bit line and includes a third side edge defining the second channel region and a fourth diffusion region that is connected to the power line and includes a fourth side edge defining the second channel region. Each of the first and second bit lines extends in a first direction, and each of the first to fourth side edges of the respective diffusion regions extends in a second direction crossing the first direction without substantial extension in the first direction.

According to another aspect of the disclosure, such a semiconductor device is provided that comprises: an active region elongated in a first direction; a plurality of bit lines extending over the active region in the first direction in substantially parallel to one another, the bit lines including first, second, third and fourth bit lines; a power line operatively supplied with a power voltage; a first diffusion region formed in the active region and electrically connected to the power line, the first diffusion region including first and second side edges opposite to each other, and each of the first and second side edges extending in a second direction crossing the first direction; a second diffusion region formed in the active region and electrically connected to the first bit line, the second diffusion region including third and fourth side edges opposite to each other, each of the third and fourth side edges extending in the second direction, and the third side edge cooperating with the first side edge of the first diffusion region to define a first channel region; a first gate electrode formed over the first channel region and electrically connected to the second bit line; a third diffusion region formed in the active region and electrically connected to the third bit line, the third diffusion region including fifth and sixth side edges opposite to each other, each of the fifth and sixth side edges extending in the second direction, and the fifth side edge cooperating with the second side edge of the first diffusion region to define a second channel region; and a second gate electrode formed over the second channel region and electrically connected to the fourth bit line.

BRIEF DESCRIPTION OF THE DRAWINGS

FIGS. 9A and 9B are diagrams comparing layouts; FIG. 9A is a prototype and FIG. 9B is the first exemplary embodiment, with regard to the sense amplifiers of the memory cell array in the semiconductor device.

DETAILED DESCRIPTION OF PREFERRED EMBODIMENTS

A representative exemplary embodiment of the present disclosure is illustrated below. In the exemplary embodiment a description is given with a configuration of a DRAM (Dynamic Random Access Memory) as a semiconductor device, but the present disclosure is not limited to a DRAM, and may include other semiconductor devices (SRAM (Static Random Access Memory), PRAM (Phase Change RAM), flash memory, or the like). The present disclosure is not limited to content of the following exemplary embodiment and may be widely applied based on content described in the scope of the claims of the present application. A description is given below of an exemplary embodiment for a case where the present disclosure is applied to a DRAM as a semiconductor device.

First Exemplary Embodiment

A description is given concerning a semiconductor device according to a first exemplary embodiment of the present disclosure, making use of the drawings.

Figure 1:
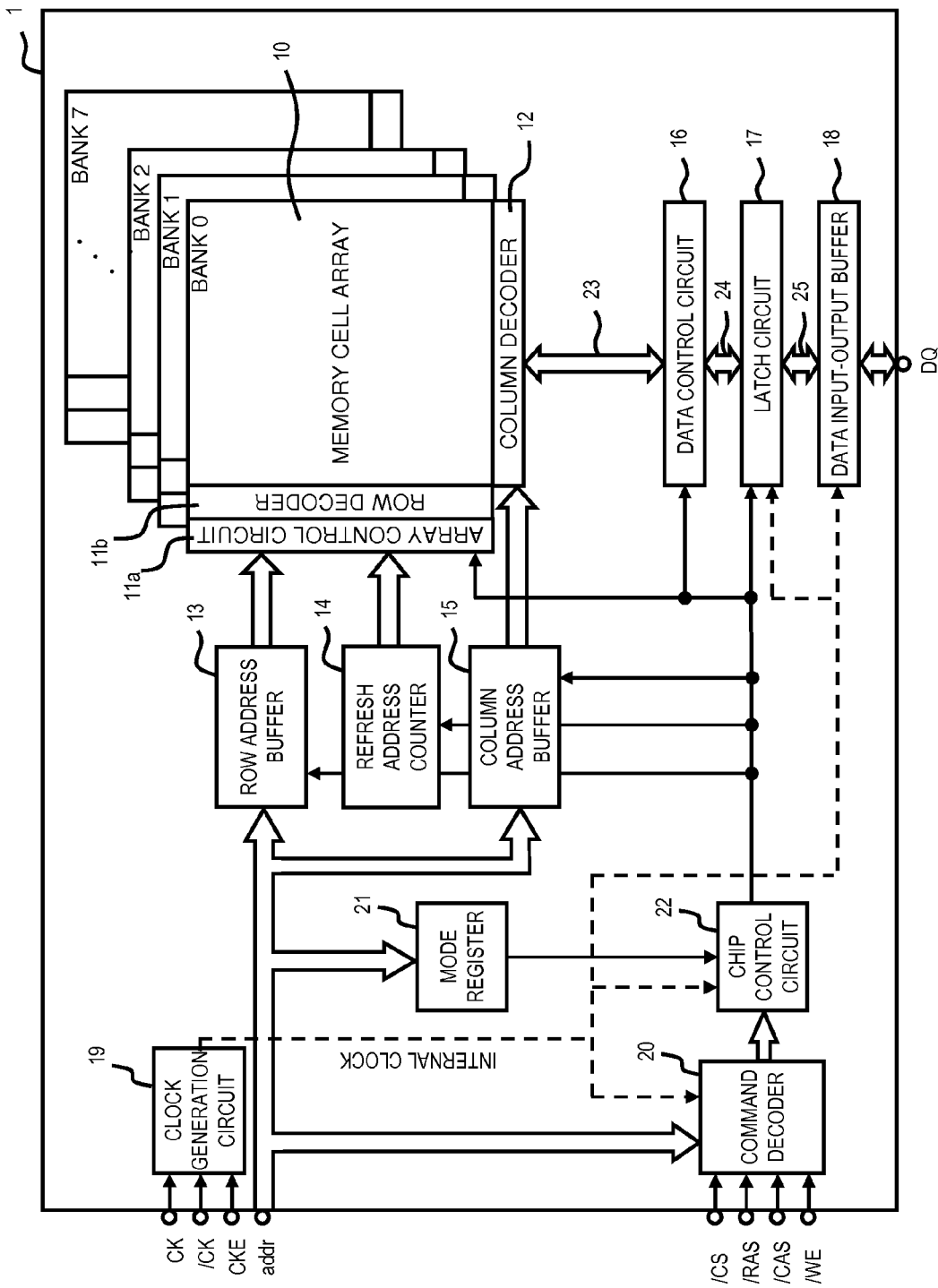
FIG. 1 is a block diagram schematically showing an overall configuration of a semiconductor device according to a first exemplary embodiment of the present disclosure.
Figure 2:
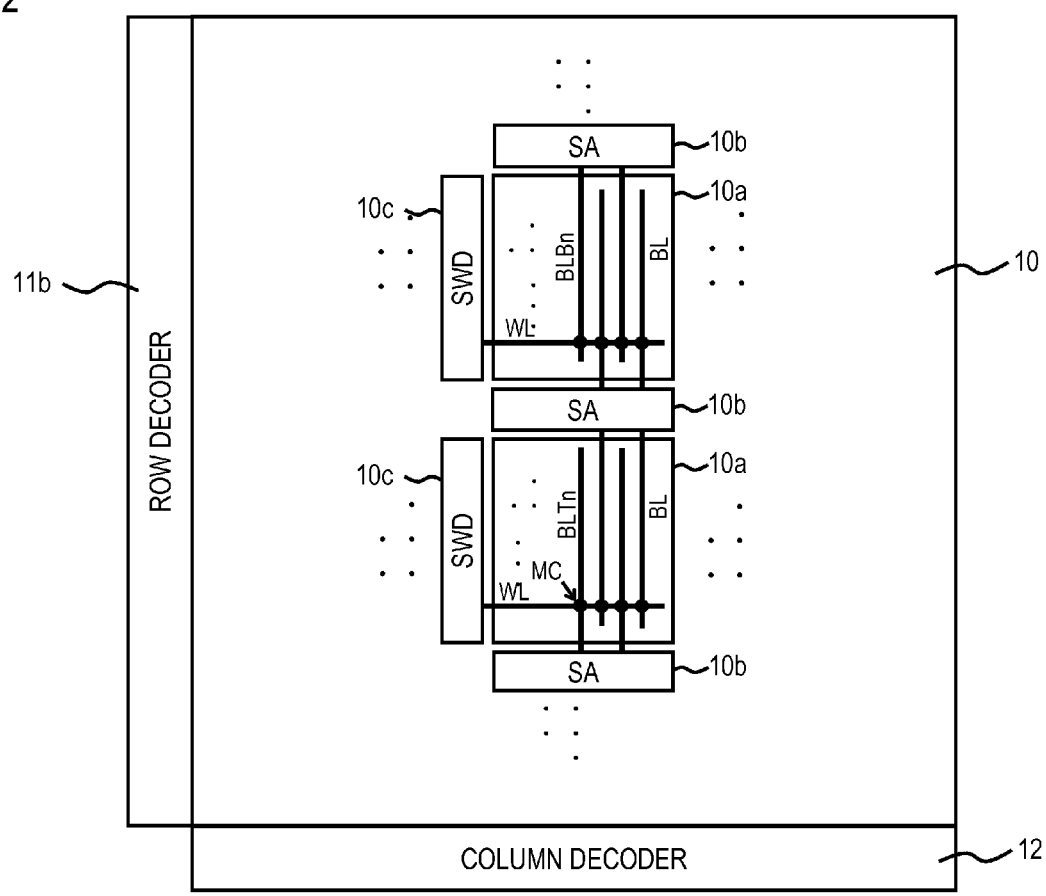
FIG. 2 is a block diagram schematically showing a configuration of a memory cell array in the semiconductor device according to the first exemplary embodiment of the disclosure.

FIG. 1 is a block diagram schematically showing an overall configuration of the semiconductor device according to the first exemplary embodiment of the disclosure. FIG. 2 is a block diagram schematically showing a configuration of a memory cell array in the semiconductor device according to the first exemplary embodiment of the disclosure.

The semiconductor device 1 is a semiconductor chip provided with a memory circuit (for example, a DRAM). The semiconductor device 1 has a bit-line-orthogonal-to-gate type sense amplifier in which gate electrodes (32 in FIG. 5, 32 in FIG. 7) of the sense amplifier (NchSA in FIG. 5, PchSA in FIG. 7) are orthogonal to bit lines (BL in FIG. 5, BL in FIG. 7), in the memory circuit. It is to be noted that, although not shown in the drawings, external power supply voltages VDD and VSS are supplied from outside to the semiconductor device 1.

The semiconductor device 1 includes, as the memory circuit, a memory cell array 10 divided into a plurality of banks 1 to 7, an array control circuit 11a and a row decoder 11b, in addition to a column decoder 12, associated with each bank 1 to 7 (see FIG. 1). The semiconductor device 1 includes, as peripheral circuitry formed around the memory circuit, a row address buffer 13, a refresh address counter 14, a column address buffer 15, a data control circuit 16, a latch circuit 17, a data input-output buffer 18, a clock generation circuit 19, a command decoder 20, a mode register 21, a chip control circuit 22, and buses 23, 24, and 25 (see FIG. 1). It is to be noted that in the example of FIG. 1, seven banks 1 to 7 are provided, but there is no particular limitation to the number of banks.

The memory cell array 10 is a circuit arranged to have a plurality of memory cells (not shown in the drawings) arrayed in a row direction and a column direction. A plurality of memory mats 10a, a plurality of sense amplifier regions (SA) 10b respectively corresponding to the plurality of memory mats 10a, and a plurality of sub word line regions (SWD) 10c are arranged in the memory cell array 10 (see FIG. 2). The memory mats 10a have a plurality of word lines WL extending in a column direction and aligned in a row direction, a plurality of bit lines BL extending in a row direction and aligned in a column direction, and a plurality of memory cells MC arranged close to respective intersection points of the word lines WL and the bit lines BL. A plurality of sense amplifier circuits (10d-1 to 10d-4 in FIG. 4) corresponding to the respective bit lines BL are arranged in the sense amplifier regions 10b. A description is given later concerning the sense amplifier circuit part 10d. A sub word driver circuit (not shown in the drawings) that drives (selects) respective word lines WL based on a signal from the row decoder 11b is arranged in the sub word driver region 10c. It is to be noted that the memory cell array 10 of the present exemplary embodiment uses an open bit system, but the present disclosure is not limited in this regard.

The row decoder 11b is a circuit that selects a row address in the memory cell array 10 via a word line WL, based on a signal from the array control circuit 11a.

The column decoder 12 is a circuit that selects a column address in the memory cell array 10 via a bit line BL, based on respective signals from the data control circuit 16 and the column address buffer 15. The column decoder 12 is connected to the data control circuit 16 via the bus 23, and is also connected to the column address buffer 15.

The array control circuit 11a is a circuit that controls respective operations of the sense amplifier circuits (10d-1 to 10d-4 in FIG. 4) and the row decoder 11b. Along with a row address from the row address buffer 13 being inputted to the array control circuit 11a, a refresh address generated by the refresh address counter 14 is inputted, and various types of command according to a determination result of the command decoder 20 are inputted via the chip control circuit 22. The array control circuit 11a supplies a word line selection signal to the row decoder 11b, and supplies various types of control signal with regard to the sense amplifier circuit part 10d. The array control circuit 11a controls respective operations of the sense amplifier circuit part 10d and the row decoder 11b based on respective signals from the row address buffer 13 and the refresh address counter 14 along with the chip control circuit 22.

Here, the various types of command include, for example, a normal operation command corresponding to a bank active command issued when in normal operation, and an auto-refresh command corresponding to an auto-refresh command issued when a refresh request is made.

On receiving a normal operation command (bank active command), the array control circuit 11a selectively activates one word line WL specified by a row address in response to a word line selection signal, and controls a sense amplification operation by the corresponding sense amplifier circuit part 10d in response to a sense amplifier control signal. An operation state at this time is called a page open state.

On receiving an auto-refresh command, the array control circuit 11a selectively activates one word line WL specified by a refresh address in response to a word line selection signal, and controls a sense amplification operation by the corresponding sense amplifier circuit part 10d in response to a sense amplifier control signal. In this way, a memory cell connected to the selected word line WL is refreshed. Thereafter, with the selected word line WL in an unselected state, the memory cell is put into a precharge state, and the auto-refresh operation is completed.

The row address buffer 13 is a buffer that holds a row address among addresses addr inputted from outside. Various types of command are inputted in response to a determination result of the command decoder 20, via the chip control circuit 22 to the row address buffer 13. The row address buffer 13 sends the row address it holds to the array control circuit 11a, based on a signal from the chip control circuit 22.

The refresh address counter 14 is a counter that generates a refresh address when the memory cell array 10 is refreshed. Various types of command are inputted in response to a determination result of the command decoder 20, via the chip control circuit 22 to the refresh address counter 14. The refresh address counter 14 sends the generated refresh address to the array control circuit 11a, based on a signal from the chip control circuit 22.

The column address buffer 15 is a buffer that holds a column address among addresses addr inputted from outside. Various types of command are inputted in response to a determination result of the command decoder 20, via the chip control circuit 22 to the column row address buffer 15. The column address buffer 15 sends the column address it holds to the column decoder 12, based on a signal from the chip control circuit 22.

The data control circuit 16 is a circuit that controls data DQ. The data control circuit 16 is connected to the column decoder 12 via the bus 23. The data control circuit 16 is connected to the latch circuit 17 via the bus 24 for data transmission. Various types of command are inputted in response to a determination result of the command decoder 20, via the chip control circuit 22 to the data control circuit 16. The data control circuit 16 sends the data DQ to the column decoder 12 or the latch circuit 17, based on a signal from the chip control circuit 22.

The latch circuit 17 is a circuit that latches (holds) the data DQ from the data input-output buffer 18 or the data control circuit 16. Various types of command are inputted in response to a determination result of the command decoder 20, via the chip control circuit 22 to the latch circuit 17. An internal clock is inputted from the clock generation circuit 19 to the latch circuit 17. The latch circuit 17 is connected to the data control circuit 16 via the bus 24 for data transmission. The latch circuit 17 is connected to the data input-output buffer 18 via the bus 25. The latch circuit 17 sends the data DQ that is latched to the data input-output buffer 18 or the data control circuit 16 based on respective signals from the chip control circuit 22 and the clock generation circuit 19.

The data input-output buffer 18 is a buffer that holds the data DQ to perform input from and output to the outside. An internal clock is received from the clock generation circuit 19 by the data input-output buffer 18. The data input-output buffer 18 is connected to the latch circuit 17 via the bus 25. The data input-output buffer 18 sends the data DQ it holds to the latch circuit 17 or the outside, based on an internal clock from the clock generation circuit 19.

The clock generation circuit 19 is a circuit that generates an internal clock based on a clock signal CK, /CK and a clock enable signal CKE received from outside. The clock generation circuit 19 supplies the generated internal clock to the data control circuit 16, the latch circuit 17, the data input-output buffer 18, the command decoder 20, and the chip control circuit 22.

The command decoder 20 is a circuit that determines a command based on a chip select signal /CS, a row address strobe signal /RAS, a column address strobe signal /CAS, and a write enable signal /WE, received from outside. The command decoder 20 receives an address addr from outside and an internal clock from the clock generation circuit 19. The command decoder 20 sends various types of command according to a determination result to the chip control circuit 22, based on the address addr and the internal clock.

The mode register 21 is a register that selectively configures an operation mode based on the address addr. The mode register 21 sends the configured operation mode to the chip control circuit 22.

The chip control circuit 22 is a circuit that controls operations of the array control circuit 11a, the row address buffer 13, the refresh address counter 14, the column address buffer 15, the data control circuit 16, and the latch circuit 17, based on various types of command from the command decoder 20. The chip control circuit 22 receives an operation mode from the mode register 21 and an internal clock from the clock generation circuit 19. The chip control circuit 22 sends a control signal based on respective signals from the clock generation circuit 19 and the mode register 21, to the array control circuit 11a, the row address buffer 13, the refresh address counter 14, the column address buffer 15, the data control circuit 16, and the latch circuit 17.

Figure 3:
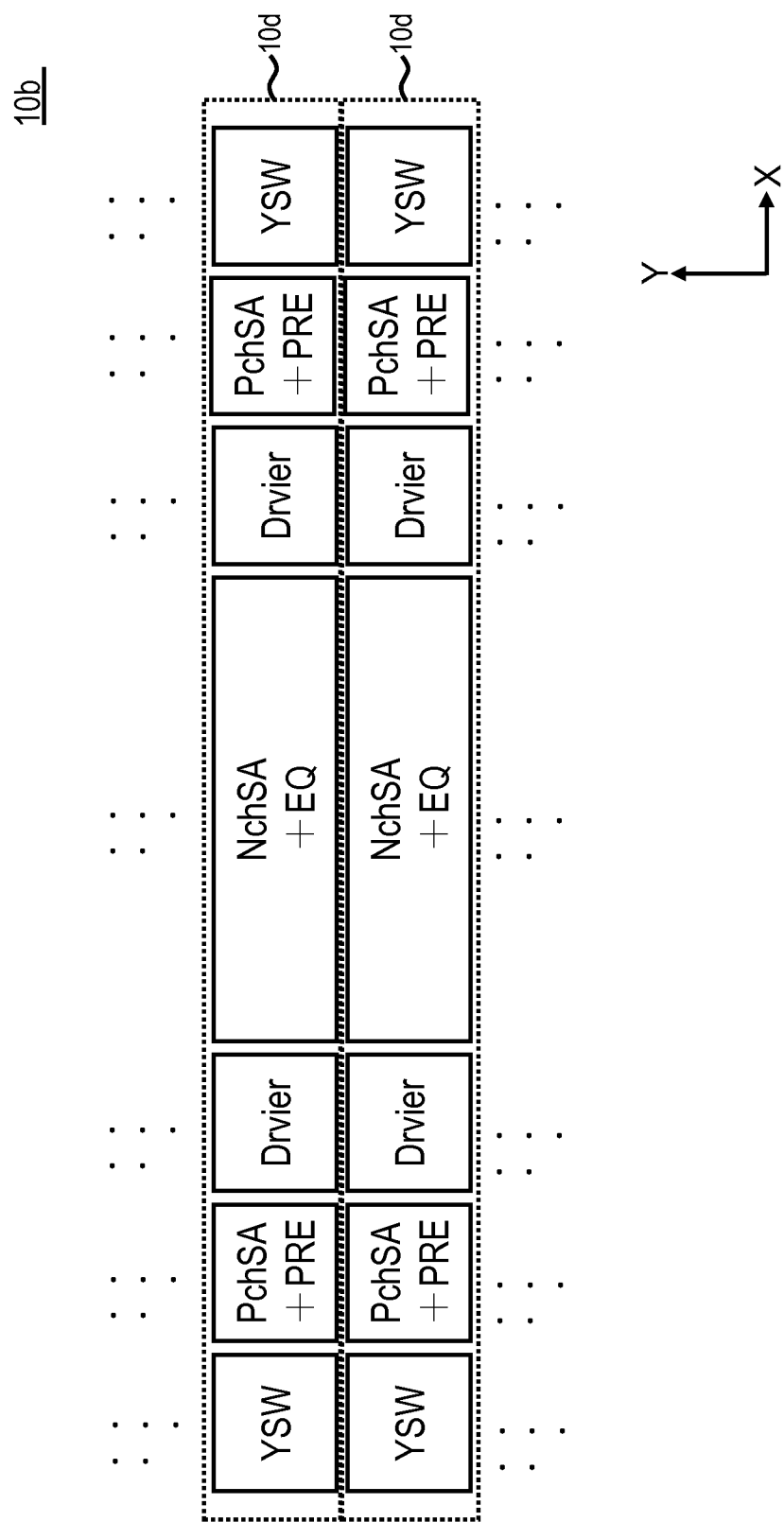
FIG. 3 is a layout diagram schematically showing a sense amplifier circuit region 10b of the memory cell array in the semiconductor device according to the first exemplary embodiment of the disclosure.
Figure 4:
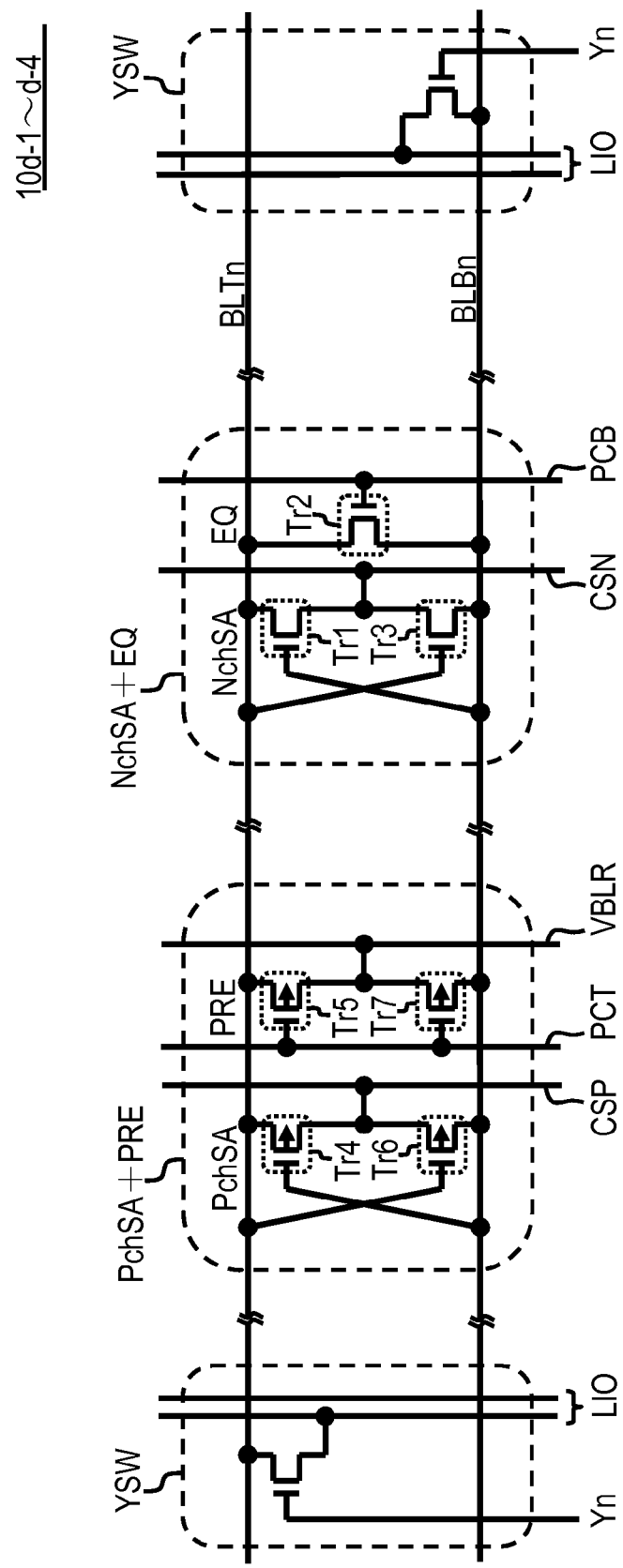
FIG. 4 is a circuit diagram schematically showing a configuration of some sense amplifiers of the memory cell array in the semiconductor device according to the first exemplary embodiment of the disclosure.

FIG. 3 is a layout diagram schematically showing the sense amplifier circuit region 10b of the memory cell array of the semiconductor device according to the first exemplary embodiment of the present disclosure. FIG. 4 is a circuit diagram schematically showing a partial configuration of a sense amplifier of the memory cell array in the semiconductor device of the first exemplary embodiment of the disclosure.

The sense amplifier circuit part 10d is arranged to be aligned in a Y direction (corresponding to a direction of extension of the word lines WL in FIG. 2), in the sense amplifier region 10b (see FIG. 3). In the present exemplary embodiment, each sense amplifier circuit part 10d is respectively provided with transistors corresponding to 4 sense amplifier circuits 10d-1 to 10d-4, namely, 4 bit line pairs (8 bit lines BLBn−2 to n+1, and BLTn−2 to n+1 in FIG. 5). In each sense amplifier circuit part 10d, a Y line switch (YSW) section, a P sense amplifier circuit (PchSA)+precharge circuit (PRE) section, a driver circuit (Driver) section, and an N sense amplifier circuit (NchSA)+equalizer circuit (EQ) section are laid out in this order in an X direction (see FIG. 3).

The YSW section is a switch section electrically connecting a local input-output line (LIO) and a bit line (BLTn, BLBn in FIG. 4) selected in response to a signal of a Y line (Yn). In the YSW section a transistor is provided to control connection between the LIO and the BLTn or BLBn (see FIG. 4). In the transistor of the YSW section, a gate electrode is connected to Yn, one of a source/drain is connected to BLTn or BLBn, and the other of the source/drain is connected to the LIO. It is to be noted that the LIO is connected to the data control circuit (16 in FIG. 1) via a main input-output line (MIO, not shown in the drawings), and a global input-output line (GIO, not shown in the drawings). Furthermore, Yn is connected to the column decoder (12 in FIG. 1).

The PchSA+PRE section is a section in which the PchSA and PRE are integrated. In the PchSA+PRE section, P-type transistors Tr4 and Tr6 are provided in order to amplify potential difference between the bit line pair (BLTn, BLBn) in the PchSA section, and P-type transistors Tr5 and Tr7 are provided for precharge control of bit lines in the PRE section (see FIG. 4).

In the P-type transistor Tr4 of the PchSA section, a gate electrode is connected to BLBn, one of a source/drain is connected to BLTn, and the other of the source/drain is connected to a power line (CSP) for the PchSA. In the P-type transistor Tr6 of the PchSA section, a gate electrode is connected to BLTn, one of a source/drain is connected to BLBn, and the other of the source/drain is connected to a PchSA power line (CSP). A combination of the P-type transistor Tr4 and the P-type transistor Tr6 forms a flip-flop that amplifies voltage (for example, 100 mV-150 mV) of a tiny signal from a memory cell read from BLBn, BLTn. CSP is a power line for the P-type transistors of the PchSA section, to supply, for example, a VARY voltage. The VARY voltage is a step-down voltage with respect to an external power supply voltage VDD, and is generated within the semiconductor device.

In the P-type transistor Tr5 of the PRE section, a gate electrode is connected to a precharge control signal line (PCT), one of a source/drain is connected to the BLTn, and the other of the source/drain is connected to a PRE power line (VBLR). In the P-type transistor Tr7 of the PRE section, a gate electrode is connected to a precharge control signal line (PCT), one of a source/drain is connected to the BLBn, and the other of the source/drain is connected to the PRE power line (VBLR). It is to be noted that the PCT is wiring for a precharge control signal generated by the chip control circuit (22 in FIG. 1), and activated when the respective sense amplifier circuits 10d-1 to 10d-4 are in an inactive state. VBLR is a power line for the precharge transistor PRE, to supply, for example, ½ of the VARY voltage.

A transistor (not shown in the drawings) is provided for driving a control signal such as an enable signal of the sense amplifier circuits 10d-1 to 10d-4 in the Driver section (see FIG. 4).

The NchSA+EQ section is a section in which the NchSA and EQ are integrated. In the NchSA+EQ section, N-type transistors Tr1 and Tr3 are provided in order to amplify a potential difference between the bit line pair (BLTn, BLBn) in the NchSA section, and an N-type transistor Tr2 is provided in the EQ section (see FIG. 4).

In the N-type transistor Tr1 of the NchSA section, a gate electrode is connected to BLBn, one of a source/drain is connected to BLTn, and the other of the source/drain is connected to an NchSA power line (CSN). In the N-type transistor Tr3 of the NchSA section, a gate electrode is connected to BLTn, one of a source/drain is connected to BLBn, and the other of the source/drain is connected to the NchSA power line (CSN). A combination of the N-type transistor Tr1 and the N-type transistor Tr3 forms a flip-flop that amplifies voltage (for example, 100 mV-150 mV) of a tiny signal from a memory cell read from BLBn, BLTn. The CSN is a power line for the N-type transistors of the NchSA section, to supply VSS, for example.

In the N-type transistor Tr2 of the EQ section, a gate electrode is connected to an equalizing control signal line (PCB), one of a source/drain is connected to BLTn, and the other of the source/drain is connected to BLBn. It is to be noted that the PCB is wiring for an equalizing control signal generated by the chip control circuit (22 in FIG. 1), and activated when the respective sense amplifier circuits 10d-1 to 10d-4 are in an inactive state.

Here, in a reading operation, read data of the bit lines BLTn, BLBn, read from a memory cell (not shown in the drawings) is amplified to a prescribed voltage by the PchSA and NchSA that form a flip-flop, and thereafter, by making Yn High and selecting YSW, is outputted to a peripheral circuit via the LIO.

In a writing operation, write data of the LIO, with Yn selected as High, is inputted to the bit lines BLTn, BLBn, and thereafter by inversion with respect to the PchSA and NchSA that form a flip-flop (where the data is the same, inversion is not performed), signals of the bit lines BLTn and BLBn are put in the same state as the write data and written to a memory cell (not shown in the drawings).

Figure 5:
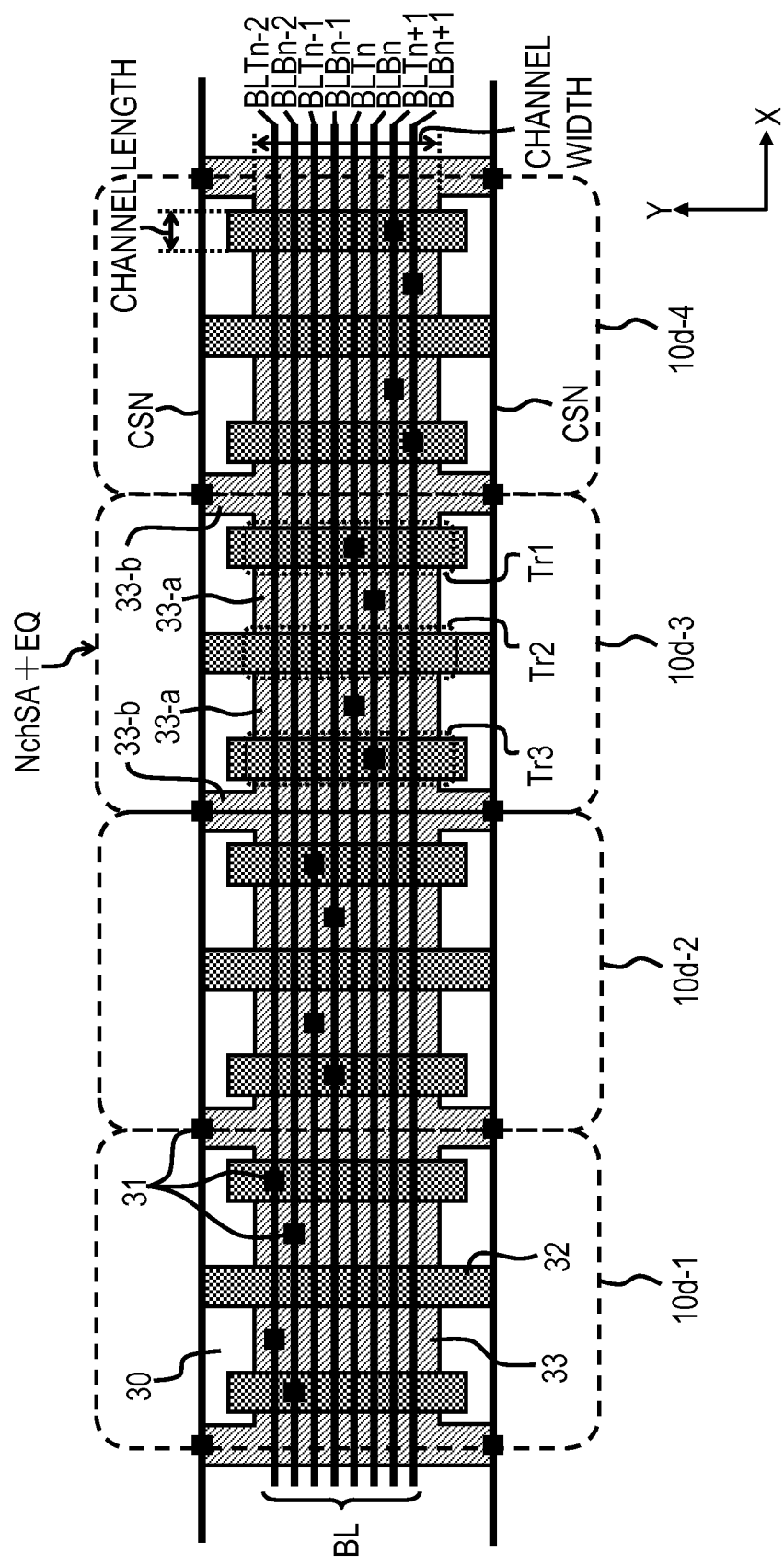
FIG. 5 is a layout diagram schematically showing a unit of an NchSA+EQ section of sense amplifier circuit part 10d of the memory cell array in the semiconductor device according to the first exemplary embodiment of the disclosure.
Figure 6:
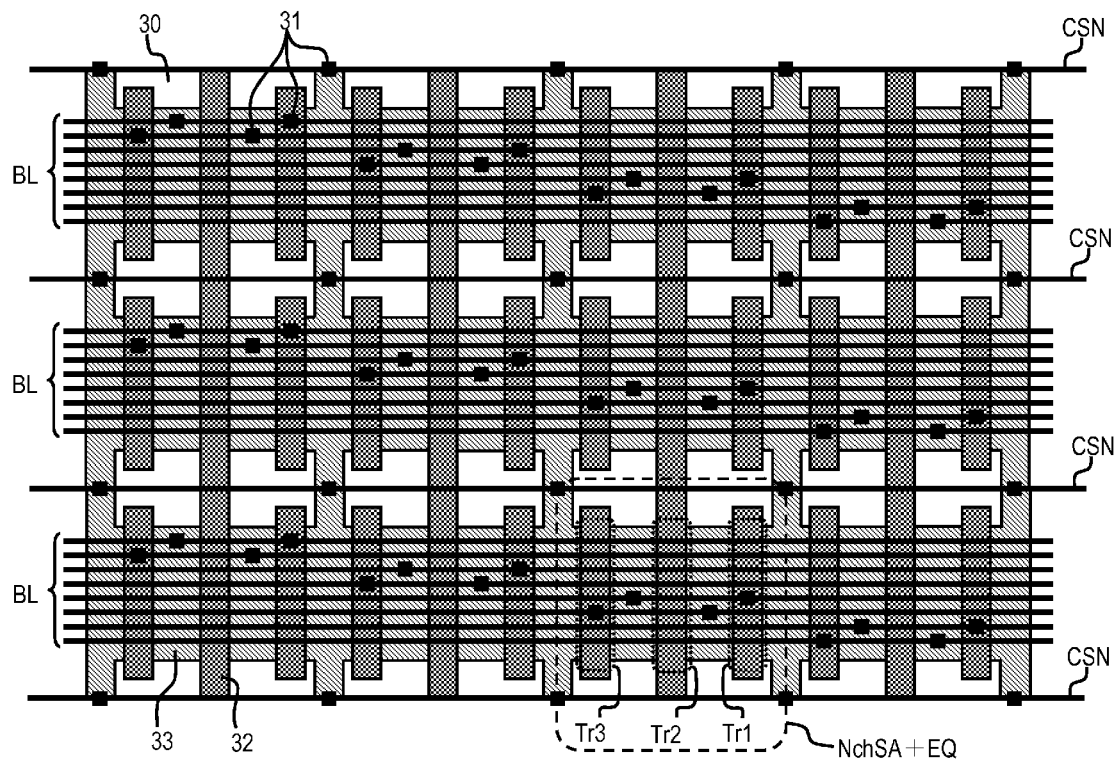
FIG. 6 is a layout diagram schematically showing a configuration in which a plurality of units of the NchSA+EQ section of the sense amplifier circuit part 10d of the memory cell array are laid out consecutively in the semiconductor device according to the first exemplary embodiment of the disclosure.

FIG. 5 is a layout diagram schematically showing a unit of the NchSA+EQ section of the sense amplifier circuit part 10d of the memory cell array in the semiconductor device according to the first exemplary embodiment of the disclosure. FIG. 6 is a layout diagram schematically showing a configuration in which a plurality of units of the NchSA+EQ section of the sense amplifier circuit part 10d of the memory cell array are laid out consecutively in the semiconductor device according to the first exemplary embodiment of the disclosure.

In the NchSA+EQ section, the transistors Tr1, Tr2, and Tr3 (corresponding to Tr1, Tr2, and Tr3 of FIG. 4) are laid out in an X direction (see FIG. 5). NchSA+EQ sections, for example, are laid out in an X direction corresponding to the 4 sense amplifier circuits 10d-1 to 10d-4 (see FIG. 5). An arrangement where the plurality of units of the NchSA+EQ section of FIG. 5 are laid out consecutively is as shown in FIG. 6.

With respect to the transistors Tr1, Tr2, Tr3, a gate electrode 32 is formed via a gate insulation film (not shown in the drawings) on a channel of a semiconductor substrate (not shown in the drawings), a diffusion region 33 forming a source/drain is formed on the semiconductor substrate (not shown in the drawings) on both sides of the channel, and a device separation structure unit 30 is formed on the semiconductor substrate (not shown in the drawings) around the diffusion region 33.

The gate electrode 32 of the transistors Tr1, Tr2, and Tr3 extends in a direction (Y direction) orthogonal to a direction (X direction) in which the bit lines BL (BLBn−2 to n+1, BLTn−2 to n+1) extend. That is, a configuration is preferred in which channel width of the respective transistors Tr1, Tr2 and Tr3 extends in the Y direction, and does not extend in the X direction. The channel width in the Y direction is preferably longer than the channel length in the X direction. The gate electrode 32 of the transistors Tr1 and Tr3 extends in the Y direction longer than the channel width and shorter than the distance between the NchSA power lines (CSN); and the two ends of the gate electrode 32 of the transistors Tr1 and Tr3 are formed on the device separation structure unit 30. The gate electrode 32 of the transistor Tr2 is connected to the gate electrode 32 of another transistor Tr4 that is adjacent in the Y direction and is laid out as a straight line extending in the Y direction; the gate electrode 32 is longer than the channel width and is longer than the distance between the NchSA power lines (CSN); and the gate electrode 32 of the transistor Tr2 is formed on the device separation structure unit 30 at a section between neighboring channels in the Y direction.

A diffusion section (33-a) of the transistor Tr2 forming an EQ section is shared (made common) with a diffusion region (33-a) of the transistors Tr1 and Tr3 of an adjacent NchSA section. In each NchSA section, each diffusion region (33-b) that is electrically connected with the CSN via a contact 31 is shared, for example, with a diffusion region (33-b) of the transistor Tr1 in the sense amplifier circuit 10d-3 and with a diffusion region (33-b) of the transistor Tr3 in the sense amplifier circuit 10d-4 that is adjacent in the X direction. In the same way, a diffusion region (33-b) of the transistor Tr3 in the sense amplifier circuit 10d-3 is shared with a diffusion region (33-b) of the transistor Tr1 in the sense amplifier circuit 10d-2 that is adjacent in the X direction. Furthermore, as in FIG. 6, respective diffusion regions (33-b) of sense amplifier circuits that are adjacent in the Y direction are shared.

Each bit line BL (BLBn−2 to n+1, BLTn−2 to n+1) is electrically connected to a corresponding diffusion region 33 and gate electrode 32 via a corresponding contact 31.

Figure 7:
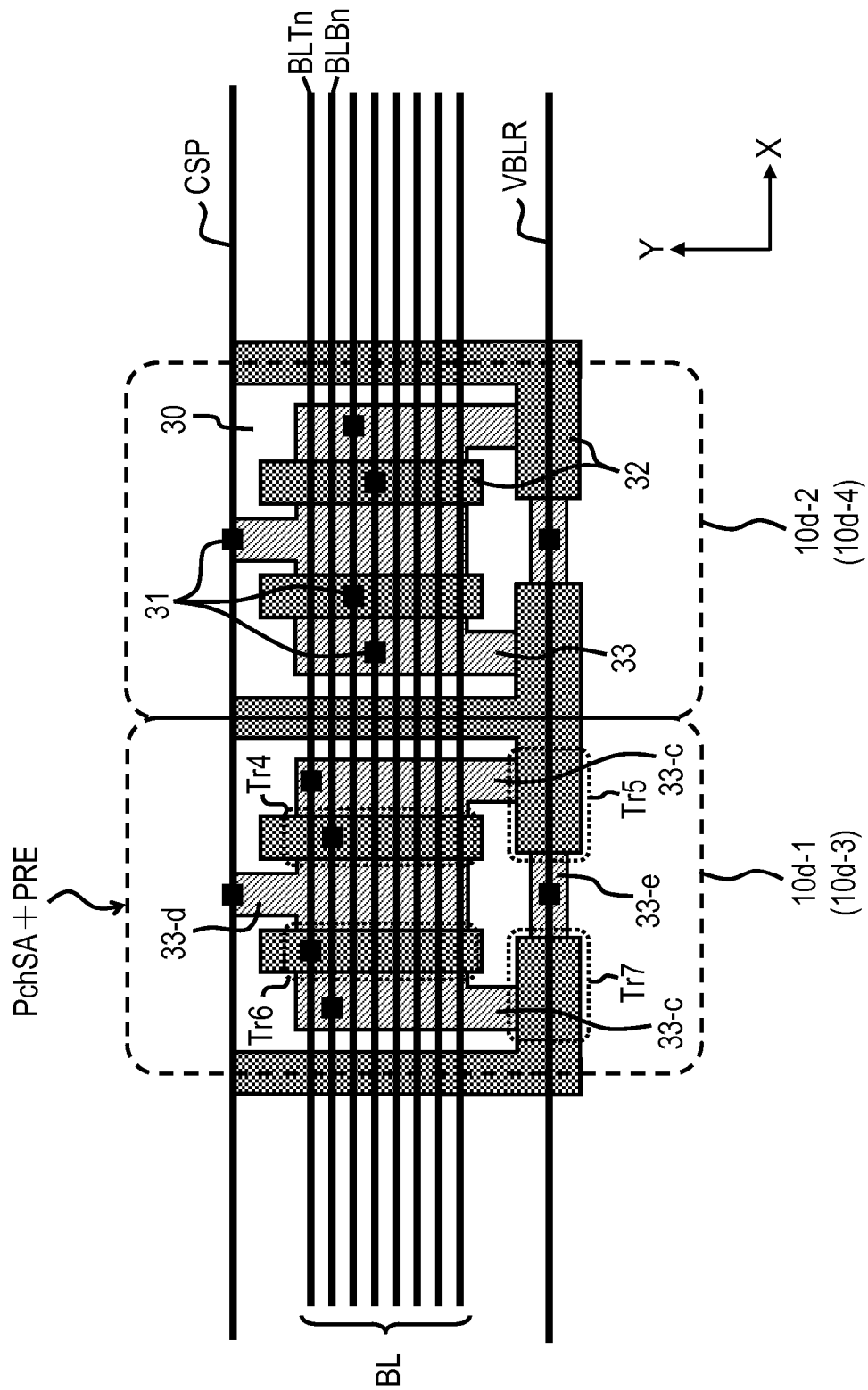
FIG. 7 is a layout diagram schematically showing a unit of a PchSA+PRE section in the sense amplifier circuit part 10d of the memory cell array in the semiconductor device according to the first exemplary embodiment of the disclosure.
Figure 8:
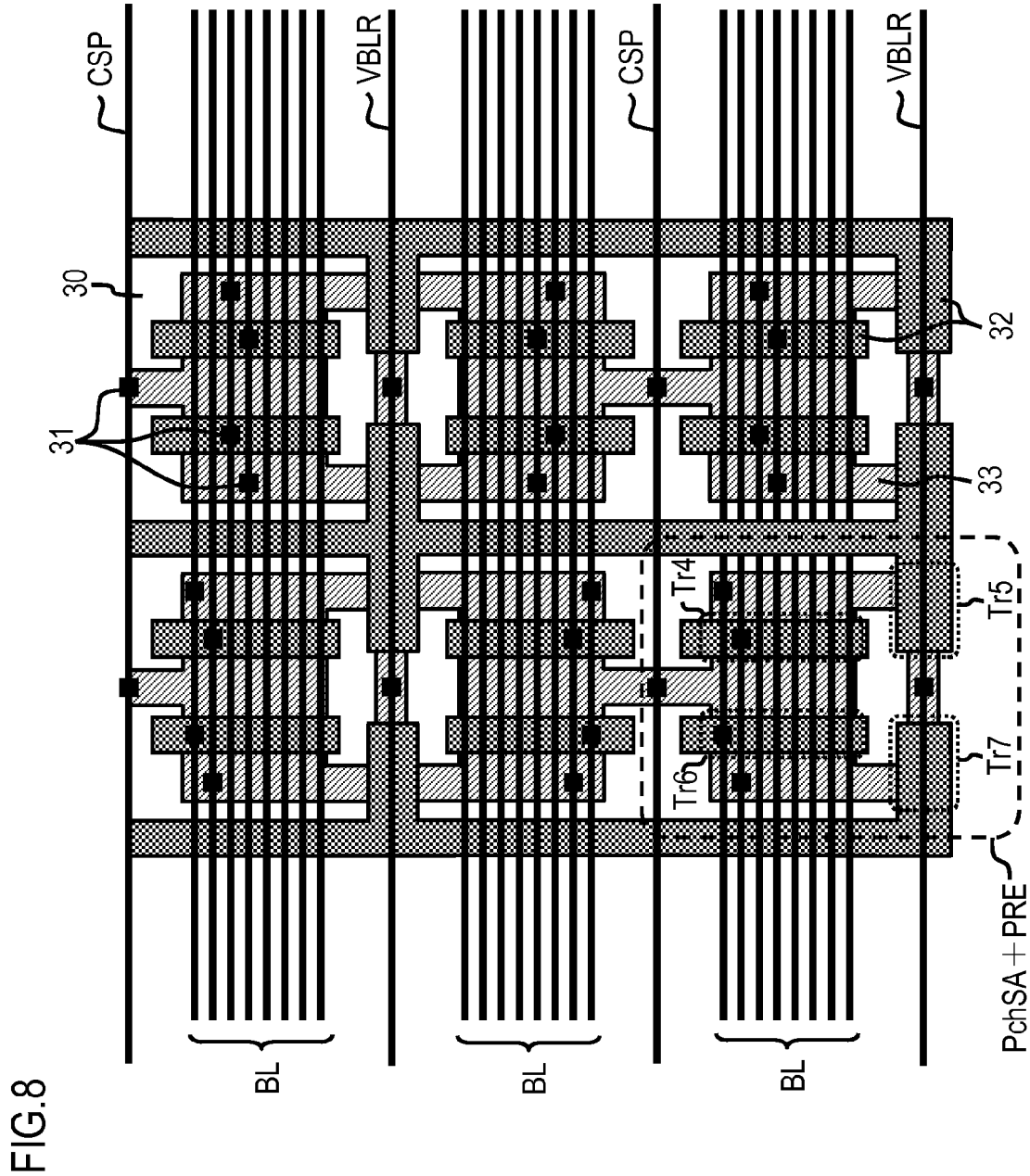
FIG. 8 is a layout diagram schematically showing a configuration in which a plurality of units of the PchSA+PRE section of the sense amplifier circuit part 10d of the memory cell array are laid out consecutively in the semiconductor device according to the first exemplary embodiment of the disclosure.

FIG. 7 is a layout diagram schematically showing units of the PchSA+PRE section in the sense amplifier circuit part 10d of the memory cell array in the semiconductor device according to the first exemplary embodiment of the disclosure. FIG. 8 is a layout diagram schematically showing a configuration in which a plurality of units of the PchSA+PRE section of the sense amplifier circuit part 10d of the memory cell array are laid out consecutively in the semiconductor device according to the first exemplary embodiment of the disclosure.

In the PchSA+PRE section, the transistors Tr4 and Tr6 (corresponding to Tr4 and Tr6 of FIG. 4) are laid out in an X direction, and the transistors Tr5 and Tr7 (corresponding to Tr5 and Tr7 of FIG. 4) are laid out in an X direction (see FIG. 7). In the PchSA+PRE section, the transistors Tr4 and Tr5 are laid out in a Y direction, and the transistors Tr6 and Tr7 are laid out in a Y direction (see FIG. 7). Respective PchSA+PRE sections, for example, are laid out in an X direction corresponding to the two sense amplifier circuits 10d-1 to 10d-2 (10d-3 to 10d-4) (see FIG. 7). An arrangement where the units of the PchSA+PRE section of FIG. 7 are consecutively laid out is as shown in FIG. 8. The unit of the PchSA+PRE section in the first stage from the bottom of FIG. 8 is arranged similarly to the unit of the PchSA+PRE section in the third stage from the bottom, and is line symmetric with respect to the unit of the PchSA+PRE section in the second stage from the bottom, with the PchSA power line (CSP) as an axis of symmetry.

With respect to the transistors Tr4, Tr5, Tr6, and Tr7, a gate electrode 32 is formed via a gate insulation film (not shown in the drawings) on a channel of the semiconductor substrate (not shown in the drawings). With respect to the transistors Tr4 and Tr6, a diffusion region 33 forming a source/drain is formed on the semiconductor substrate (not shown in the drawings) on the two sides of the channel. With respect to the transistors Tr5 and Tr7, a diffusion region 33 forming a source/drain is formed on the semiconductor substrate (not shown in the drawings) on a first edge and a second edge (the second edge being in a direction orthogonal to the first edge) of the channel. A device separation structure unit 30 is formed on the semiconductor substrate (not shown in the drawings) around the diffusion regions 33.

The gate electrode 32 of the transistors Tr4 and Tr6 extends in a direction (Y direction) orthogonal to the direction (X direction) in which the bit lines BL extend. The gate electrode 32 of the transistors Tr4 and Tr6 extends in the Y direction longer than the channel width and shorter than a CSP-VBLR distance, and the two ends of the gate electrode 32 of the transistors Tr4 and Tr6 are formed on the device separation structure unit 30.

The gate electrode 32 of the transistors Tr5 and Tr7 extends in a direction (X direction) parallel to the direction (X direction) in which the bit lines BL extend. The gate electrode 32 of the transistor Tr5 (or Tr7) is connected to the gate electrode 32 of the transistor Tr7 (or Tr5) of another PchSA+PRE section that is adjacent in the X direction, and is connected to the gate electrode 32 of the transistor Tr5 (or Tr7) of another PchSA+PRE section that is adjacent in the Y direction.

A first (33-$d$) diffusion region of transistor Tr4 is shared (in common with) with a first (33-$d$) diffusion region of transistor Tr6, and is electrically connected with a PchSA power line (CSP) via a contact 31. A first (33-$e$) diffusion region of transistor Tr5 is shared (in common with) with a first (33-$e$) diffusion region of transistor Tr7, and is electrically connected with a PRE power line (VBLR) via a contact 31. A second (33-$c$) diffusion region of transistor Tr4 is shared (in common with) with a second (33-$c$) diffusion region of transistor Tr5. A second (33-$c$) diffusion region of transistor Tr6 is shared (in common with) with a second (33-$c$) diffusion region of transistor Tr7. Each bit line BL is electrically connected to a corresponding diffusion region 33 and a gate electrode 32 via a corresponding contact 31.

Next, a description is given concerning a simulation result of a layout of the semiconductor device according to the first exemplary embodiment of the disclosure, making use of the drawings. FIG. 9 is a diagram comparing simulation results of (9A) a prototype and (9B) the first exemplary embodiment, of a layout of the sense amplifier region of the memory cell array in the semiconductor device.

FIG. 9A is a simulation result of the layout of the sense amplifier region (equivalent to 10$b$ of FIG. 2) of the prototype investigated before the inventor arrived at the first exemplary embodiment. In FIG. 9A, a diffusion region of a precharge transistor (PRE) and an equalizer transistor (EQ) is shared, and a gate electrode of each transistor extends in the same direction as the direction (X direction) of extension of the bit lines.

FIG. 9B is a simulation result of the layout of the sense amplifier region (10$b$ in FIG. 2 and FIG. 3) of the first exemplary embodiment. In the first exemplary embodiment, the gate electrodes of the sense amplifier circuit (10$d$ of FIG. 3 and FIG. 4) are arranged so as to extend in a direction (Y direction) orthogonal to a direction (X direction) of extension of the bit lines, and furthermore the diffusion regions of the respective transistors of the precharge circuit (PRE) and the P-type sense amplifier circuit (PchSA), the equalizer circuit (EQ), and the NchSA are each shared. In this way, in the first exemplary embodiment the sense amplifier region can be reduced by approximately 0.8 μm in the X direction, in comparison to the prototype of FIG. 9A.

As miniaturization further proceeds henceforth and the memory cell array region is reduced, bit line pitch will also be reduced. However, in a case of the layout as in the prototype of FIG. 9A, if lithography processing limitations for transistors in the Y direction are exceeded, bit line width and space cannot be further reduced. Accordingly, by arranging the gate electrodes of the sense amplifier circuit part 10$d$ so as extend in a direction (Y direction) orthogonal to the direction in which the bit lines extend, as in the first exemplary embodiment of FIG. 9B, the lithography processing limitations of transistors in the Y direction are raised in comparison to the prototype of FIG. 9A, and it becomes possible to further reduce the pitch of the bit lines.

According to the first exemplary embodiment, by having the channel width of the channel regions for the transistors Tr1, Tr2 and Tr3 of the sense amplifier circuits 10$d$-1 to 10$d$-4 extend in a direction (Y direction) that is orthogonal to the direction (X direction) of extension of the bit lines BL (BLBn−2 to n+1, BLTn−2 to n+1) (not extending in a direction of extension of the bit lines), it is possible to further reduce the region in which the sense amplifier circuit part 10$d$ is arranged in the direction (X direction) of extension of the bit lines BL (BLBn−2 to n+1, BLTn−2 to n+1) (see FIG. 4 and FIG. 5). In this way, it is possible to reduce chip size and to decrease chip cost. By so doing, it is possible to relax the pitch of the bit lines BL (BLBn−2 to n+1, BLTn−2 to n+1) in the sense amplifier circuit part 10$d$, and to facilitate device fabrication. Furthermore, by so doing, it is possible to layout the transistors of the sense amplifier circuit part 10$d$ even if the pitch of the bit lines BL (BLBn−2 to n+1, BLTn−2 to n+1) is reduced.

According to the first exemplary embodiment, by a layout in which the equalizer circuit (EQ) and the N-type sense amplifier circuit (NchSA) are integrated, it is possible to reduce the layout width of the sense amplifier circuit part 10$d$ (see FIG. 3 to FIG. 5).

According the first exemplary embodiment, by a layout in which the precharge (PRE) and the P-type sense amplifier circuit (PchSA) are integrated, it is possible to reduce the layout width of the sense amplifier circuit part 10$d$ (see FIG. 3, FIG. 4, and FIG. 7).

It is to be noted that reference symbols attached to the drawings in the present application are solely to aid understanding and are not intended to limit the invention to modes shown in the drawings.

Modifications and adjustments of exemplary embodiments and examples are possible within the bounds of the entire disclosure (including the scope of the claims and drawings) of the present invention, and also based on fundamental technological concepts thereof. Furthermore, various combinations and selections of various disclosed elements (including respective elements of the respective claims, respective elements of the respective exemplary embodiments and examples, and respective elements of the respective drawings) are possible within the scope of the claims of the present invention. That is, the present invention clearly includes every type of transformation and modification that a person skilled in the art can realize according to the entire disclosure including the claims and drawings, to technological concepts thereof.

What is claimed is:

1. A semiconductor device, comprising:
a first memory cell;
a second memory cell;
a first bit line extending in a first direction and being connected to the first memory cell;
a second bit line extending in the first direction and being connected to the second memory cell;
a first power line; and
a sense amplifier circuit comprising a first transistor and a second transistor, the first transistor including a first gate electrode that is formed over a first channel region and connected to the first bit line, a first diffusion region that is connected to the second bit line and includes a first side edge defining the first channel region and a second diffusion region that is connected to the first power line and includes a second side edge defining the first channel region, and the second transistor including a second gate electrode that is formed over a second channel region and connected to the second bit line, a third diffusion region that is connected to the first bit line and includes a third side edge defining the second channel region and a fourth diffusion region that is connected to the first power line and includes a fourth side edge defining the second channel region;
wherein each of the first side edge of the first diffusion region, the second side edge of the second diffusion region, the third side edge of the third diffusion region and the fourth side edge of the fourth diffusion region extends in a second direction, that crosses the first direction, without substantial extension in the first direction;
wherein the sense amplifier circuit further comprises a third transistor that includes a third gate electrode that receives an equalizing control signal, the first diffusion region, the third diffusion region, and a third channel region provided between the first diffusion region and the third diffusion region; and
wherein the third transistor electrically connects the first diffusion region and the third diffusion region in response to activation by the equalizing control signal.

2. The semiconductor device according to claim 1, wherein each of the first and second channel regions includes a channel width that is greater than a channel length.

3. The semiconductor device according to claim 1, wherein the first gate electrode, the second gate electrode, the third gate electrode, the first diffusion region, the second diffusion region, the third diffusion region, and the fourth diffusion region are arranged in line in the first direction.

4. The semiconductor device according to claim 1, further comprising:
a third memory cell;
a fourth memory cell;
a third bit line extending in the first direction and being connected to the third memory cell; and
a fourth bit line extending in the first direction and being connected to the fourth memory cell;
wherein the sense amplifier circuit further comprises a fourth transistor and a fifth transistor, the fourth transistor including a fourth gate electrode that is formed over a fourth channel region and connected to the third bit line, a fifth diffusion region that is connected to the fourth bit line and includes a fifth side edge defining the fourth channel region and a sixth diffusion region that is connected to the first power line and includes a sixth side edge defining the fourth channel region, and the fifth transistor including a fifth gate electrode that is formed over a sixth channel region and connected to the fourth bit line, a seventh diffusion region that is connected to the third bit line and includes a seventh side edge defining the sixth channel region and an eighth diffusion region that is connected to the first power line and includes an eighth side edge defining the sixth channel region; and
wherein each of the fifth side edge of the fifth diffusion region, the sixth side edge of the sixth diffusion region, the seventh side edge of the seventh diffusion region and the eighth side edge of the eighth diffusion region extends in the second direction, that crosses the first direction, without substantial extension in the first direction.

5. The semiconductor device according to claim 4, wherein the sense amplifier circuit further comprises:
a sixth transistor that is arranged to be adjacent in the second direction to the third transistor, and includes the third gate electrode, the sixth diffusion region, the eighth diffusion region, and a sixth channel provided between the sixth diffusion region and the eighth diffusion region.

6. The semiconductor device according to claim 1, further comprising a second power line;
wherein the sense amplifier circuit further comprises:
a fourth transistor, the third gate electrode formed over the third channel region and connected to the first bit line, a fifth diffusion region that is connected to the second bit line and includes a fifth side edge defining the third channel region and a sixth diffusion region that is connected to the second power line and includes a sixth side edge defining the third channel region, and the fourth transistor including a fourth gate electrode that is formed over a fourth channel region and connected to the second bit line, a seventh diffusion region that is connected to the first bit line and includes a seventh side edge defining the fourth channel region and an eighth diffusion region that is connected to the second power line and includes an eighth side edge defining the fourth channel region;
wherein each of the fifth side edge of the fifth diffusion region, the sixth side edge of the sixth diffusion region, the seventh side edge of the seventh diffusion region and the sixth side edge of the sixth diffusion region extends in a second direction, that crosses the first direction, without substantial extension in the first direction.

7. A semiconductor device comprising:
an active region elongated in a first direction;
a plurality of bit lines extending over the active region in the first direction in substantially parallel to one another, the bit lines including first, second, third and fourth bit lines;
a power line operatively supplied with a power voltage;
a first diffusion region formed in the active region and electrically connected to the power line, the first diffusion region including first and second side edges opposite to each other, and each of the first and second side edges extending in a second direction crossing the first direction;
a second diffusion region formed in the active region and electrically connected to the first bit line, the second diffusion region including third and fourth side edges opposite to each other, each of the third and fourth side edges extending in the second direction, and the third side edge cooperating with the first side edge of the first diffusion region to define a first channel region;

a first gate electrode formed over the first channel region and electrically connected to the second bit line;

a third diffusion region formed in the active region and electrically connected to the third bit line, the third diffusion region including fifth and sixth side edges opposite to each other, each of the fifth and sixth side edges extending in the second direction, and the fifth side edge cooperating with the second side edge of the first diffusion region to define a second channel region; and a second gate electrode formed over the second channel region and electrically connected to the fourth bit line.

8. The device as claimed in claim 7, wherein the power line extends in the first direction along the active region.

9. The device as claimed in claim 8, further comprising first and second isolation regions each extending in the first direction to define the active region therebetween, the power line extending over the first isolation region.

10. The device as claimed in claim 9, further comprising an additional power line operatively supplied with power voltage, the additional power line extending over the second isolation region in the first direction and electrically connected to the first diffusion region.

11. The device as claimed in claim 7, further comprising:

a fourth diffusion region formed in the active region and electrically connected to the second bit line, the fourth diffusion region including seventh and eighth side edges opposite to each other, each of the seventh and eighth side edges extending in the second direction, the seventh side edge cooperating with the fourth side edge of the second diffusion region to define a third channel region;

a third gate electrode formed over the third channel region;

a fifth diffusion region formed in the active region and electrically connected to the fourth bit line, the fifth diffusion region including ninth and tenth side edges opposite to each other, each of the ninth and tenth side edges extending in the second direction, and the ninth side edge cooperating with the sixth side edge of the third diffusion region to define a fourth channel region; and a fourth gate electrode formed over the fourth channel region and electrically connected to the third gate electrode.

12. The device as claimed in claim 11, wherein the power line extends in the first direction along the active region.

13. The device as claimed in claim 12, further comprising an additional power line operatively supplied with the power voltage and electrically connected to the first diffusion region, the additional power line extending in the first direction along the active region, the power line and the additional power lines sandwiching the first, second, third and fourth bit lines therebetween.

14. The device as claimed in claim 11, further comprising:

a sixth diffusion region formed in the active region and including eleventh and twelfth side edges opposite to each other, each of the eleventh and twelfth side edges extending in the second direction, the eleventh side edge cooperating with the eighth side edge of the fourth diffusion region to define a fifth channel region;

a fifth gate electrode formed over the fifth channel region and electrically connected to the first bit line;

a seventh diffusion region formed in the active region and including thirteenth and fourteenth side edges opposite to each other, each of the thirteenth and fourteenth side edges extending in the second direction, and the thirteenth side edge cooperating with the tenth side edge of the fifth diffusion region to define a sixth channel region; and a sixth gate electrode formed over the fourth channel region and electrically connected to the third bit line.

15. The device as claimed in claim 14, wherein each of the sixth and seventh diffusion regions is electrically connected to the power line.

16. The device as claimed in claim 15, wherein the power line extends in the first direction along the active region.

17. The device as claimed in claim 16, further comprising an additional power line operatively supplied with the power voltage and electrically connected to the first diffusion region, the additional power line extending in the first direction along the active region, the power line and the additional power lines sandwiching the first, second, third and fourth bit lines therebetween.

18. The device as claimed in claim 11, wherein each of the third and fourth gate electrodes is supplied with an equalizing signal.

19. The device as claimed in claim 14, further comprising first and second isolation regions each extending in the first direction to define the active region therebetween, each of the first, second, third, fourth, fifth, sixth and seventh diffusion regions including first and second end portions in the second direction that are in contact with the first and second isolation regions, respectively.

* * * * *